United States Patent
Jee et al.

(10) Patent No.: US 11,282,792 B2
(45) Date of Patent: Mar. 22, 2022

(54) SEMICONDUCTOR PACKAGE HAVING DUMMY PADS AND METHOD OF MANUFACTURING SEMICONDUCTOR PACKAGE HAVING DUMMY PADS

(71) Applicant: Samsung Electronics Co., Ltd., Suwon-si (KR)

(72) Inventors: Young Kun Jee, Cheonan-si (KR); Hae-Jung Yu, Seoul (KR); Sangwon Kim, Asan-si (KR); Un-Byoung Kang, Hwaseong-si (KR); Jongho Lee, Hwaseong-si (KR); Dae-Woo Kim, Seongnam-si (KR); Wonjae Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 75 days.

(21) Appl. No.: 16/805,890

(22) Filed: Mar. 2, 2020

(65) Prior Publication Data
US 2021/0005553 A1   Jan. 7, 2021

(30) Foreign Application Priority Data

Jul. 5, 2019   (KR) .......................... 10-2019-0081352

(51) Int. Cl.
*H01L 23/538* (2006.01)
*H01L 25/18* (2006.01)
*H01L 23/498* (2006.01)

(52) U.S. Cl.
CPC .... *H01L 23/5383* (2013.01); *H01L 23/49816* (2013.01); *H01L 23/49822* (2013.01); *H01L 25/18* (2013.01)

(58) Field of Classification Search
CPC ......... H01L 23/49816; H01L 23/49822; H01L 23/528; H01L 23/5383; H01L 23/5386;
(Continued)

(56) References Cited

U.S. PATENT DOCUMENTS 6,448,639 B1   9/2002   Ma
7,838,337 B2   11/2010  Marimuthu et al.
(Continued)

*Primary Examiner* — Allan R Wilson
(74) *Attorney, Agent, or Firm* — Muir Patent Law, PLLC

(57) ABSTRACT

A semiconductor package includes a package substrate, a plurality of package terminals disposed on the bottom surface of the package substrate, and an interposer substrate disposed on the top surface of the package substrate, a plurality of interposer terminals disposed on the bottom surface of the interposer substrate and electrically connected to the package substrate, a first semiconductor chip disposed on the top surface of the interposer substrate, a second semiconductor chip disposed on the top surface of the interposer substrate and disposed to be horizontally separated from the first semiconductor chip, a first plurality of signal pads disposed on the top surface of the interposer substrate and electrically connected to wiring in the interposer substrate and one or more circuits in the first semiconductor chip, a second plurality of signal pads disposed on the top surface of the interposer substrate and electrically connected to wiring in the interposer substrate and to one or more circuits in the second semiconductor chip, and a plurality of dummy pads disposed outside of an area occupied by the first semiconductor chip or the second semiconductor chip from a top-down view and disposed on the top surface of the interposer substrate. Each pad of the first plurality of signal pads and the second plurality of signal pads is configured to transfer signals between the interposer substrate and a respective semiconductor chip, and each pad of the dummy pads is not configured to transfer signals between the interposer substrate and any semiconductor chip disposed thereon.

20 Claims, 12 Drawing Sheets

(58) Field of Classification Search
CPC ......... H01L 24/06; H01L 24/97; H01L 25/18; H01L 25/0655
See application file for complete search history.

(56) References Cited

U.S. PATENT DOCUMENTS

| | | |
|---|---|---|
| 7,855,443 B2 | 12/2010 | Tsai et al. |
| 8,136,737 B2 | 3/2012 | Salfelner |
| 8,227,924 B2 | 7/2012 | Shen et al. |
| 8,263,439 B2 | 9/2012 | Marimuthu et al. |
| 8,497,576 B2 | 7/2013 | Fujii |
| 8,581,389 B2 | 11/2013 | Chen et al. |
| 8,987,009 B1 * | 3/2015 | Chen ................ H01L 24/17 438/16 |
| 9,607,967 B1 * | 3/2017 | Shih ................ H01L 25/0657 |
| 9,691,686 B2 | 6/2017 | Huang et al. |
| 10,211,149 B2 | 2/2019 | Harr et al. |
| 2012/0298410 A1 * | 11/2012 | Lu ................ H01L 23/49827 174/264 |
| 2016/0027764 A1 * | 1/2016 | Kim ................ H01L 24/97 257/686 |
| 2016/0276307 A1 * | 9/2016 | Lin ................ H01L 21/561 |
| 2018/0323160 A1 | 11/2018 | Shih et al. |
| 2019/0019742 A1 | 1/2019 | Lee et al. |

* cited by examiner

Comparative Embodiment

SEMICONDUCTOR PACKAGE HAVING DUMMY PADS AND METHOD OF MANUFACTURING SEMICONDUCTOR PACKAGE HAVING DUMMY PADS

CROSS-REFERENCE TO RELATED APPLICATIONS

This U.S. non-provisional patent application claims priority under 35 U.S.C. § 119 to Korean Patent Application No. 10-2019-0081352, filed on Jul. 5, 2019, in the Korean Intellectual Property Office, the entire contents of which are hereby incorporated by reference.

BACKGROUND OF THE INVENTION

The present disclosure relates to a semiconductor package, and in particular, to a semiconductor package in which a first die and a second die are disposed side by side on an interposer substrate.

In the semiconductor industry, various package technologies have been developed to meet demands for large storage, thin thickness, and small size of semiconductor devices and/or electronic appliances. In the case where an integrated circuit (IC) chip is embedded in a semiconductor package, it is possible to easily use the IC chip as a part of an electronic product. The semiconductor package may generally include a printed circuit board (PCB) and a semiconductor chip which is provided on and electrically connected to the PCB through a bonding wire or a bump. As the semiconductor industry matures, there is an increasing demand for high-performance, high-speed, and compact semiconductor packages.

SUMMARY

An embodiment of the inventive concept provides a semiconductor package with improved electrical characteristics.

According to some embodiments, a semiconductor package is provided. The semiconductor package includes a package substrate having a bottom surface and a top surface, a plurality of package terminals disposed on the bottom surface of the package substrate, and an interposer substrate disposed on the top surface of the package substrate, the interposer substrate having a bottom surface facing the package substrate and a top surface opposite the bottom surface. The semiconductor package also includes a plurality of interposer terminals disposed on the bottom surface of the interposer substrate and electrically connected to the package substrate, a first semiconductor chip disposed on the top surface of the interposer substrate, a second semiconductor chip disposed on the top surface of the interposer substrate and disposed to be horizontally separated from the first semiconductor chip, a first plurality of signal pads disposed on the top surface of the interposer substrate and electrically connected to wiring in the interposer substrate and one or more circuits in the first semiconductor chip, a second plurality of signal pads disposed on the top surface of the interposer substrate and electrically connected to wiring in the interposer substrate and to one or more circuits in the second semiconductor chip, and a plurality of dummy pads disposed outside of an area occupied by the first semiconductor chip from a top-down view and outside of an area occupied by the second semiconductor chip from a top-down view and disposed on the top surface of the interposer substrate. The first plurality of signal pads, the second plurality of signal pads, and the plurality of dummy pads are all located at the same vertical height above the top surface of the package substrate. In addition, each pad of the first plurality of signal pads and the second plurality of signal pads is configured to transfer signals between the interposer substrate and a respective semiconductor chip, and each pad of the dummy pads is not configured to transfer signals between the interposer substrate and any semiconductor chip disposed thereon.

According to some embodiments, which may be the same or different embodiments as described above, A semiconductor package is provided. The semiconductor package includes a package substrate having a bottom surface and a top surface, a plurality of package terminals disposed on the bottom surface of the package substrate, and an interposer substrate disposed on the top surface of the package substrate, the interposer substrate having a bottom surface facing the package substrate and a top surface opposite the bottom surface. A plurality of interposer terminals are disposed on the bottom surface of the interposer substrate and electrically connected to the package substrate. A first semiconductor chip is disposed on the top surface of the interposer substrate, and a second semiconductor chip is disposed on the top surface of the interposer substrate and is disposed to be horizontally separated from the first semiconductor chip. A first plurality of signal pads are disposed on the top surface of the interposer substrate and are electrically connected to wiring in the interposer substrate and one or more circuits in the first semiconductor chip. A second plurality of signal pads are disposed on the top surface of the interposer substrate and are electrically connected to wiring in the interposer substrate and to one or more circuits in the second semiconductor chip. A plurality of dummy pads are disposed outside of an area occupied by the first semiconductor chip from a top-down view and outside of an area occupied by the second semiconductor chip from a top-down view and are disposed on the top surface of the interposer substrate. The first plurality of signal pads, the second plurality of signal pads, and the plurality of dummy pads are all located at the same vertical height above the top surface of the package substrate, and a set of dummy pads of the plurality of dummy pads are outside of an area occupied by an outer boundary of outermost interposer terminals of the interposer substrate, from a top-down view.

According to some embodiments, a method of manufacturing a semiconductor package includes providing a package substrate having a bottom surface and a top surface, providing a plurality of package terminals on the bottom surface of the package substrate, and providing an interposer including an interposer substrate having a top surface and a bottom surface. The interposer includes a plurality of interposer terminals disposed on the bottom surface of the interposer substrate, a first plurality of signal pads disposed on the top surface of the interposer substrate to occupy a first area of the interposer substrate, and electrically connected to wiring in the interposer substrate, the first plurality of signal pads for electrically connecting to one or more circuits in a first semiconductor chip, a second plurality of signal pads disposed on the top surface of the interposer substrate to occupy a second area of the interposer substrate, the second area horizontally separate from the first area, the second plurality of signal pads electrically connected to wiring in the interposer substrate and for electrically connecting to one or more circuits in a second semiconductor chip, and a plurality of dummy pads disposed outside of the first area and the second area from a top-down view and disposed on the top surface of the interposer substrate. The method further includes mounting the interposer on the top surface of the package substrate so that the plurality of interposer terminals are between the interposer substrate and the package substrate, and performing a heat bonding process to bond the interposer substrate to the package substrate through the interposer terminals. The heat bonding process includes applying heat and pressure to the interposer substrate by pressing a heat-bonding head on the top surface of the interposer substrate and heating the first plurality of signal pads, the second plurality of signal pads, and the plurality of dummy pads.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
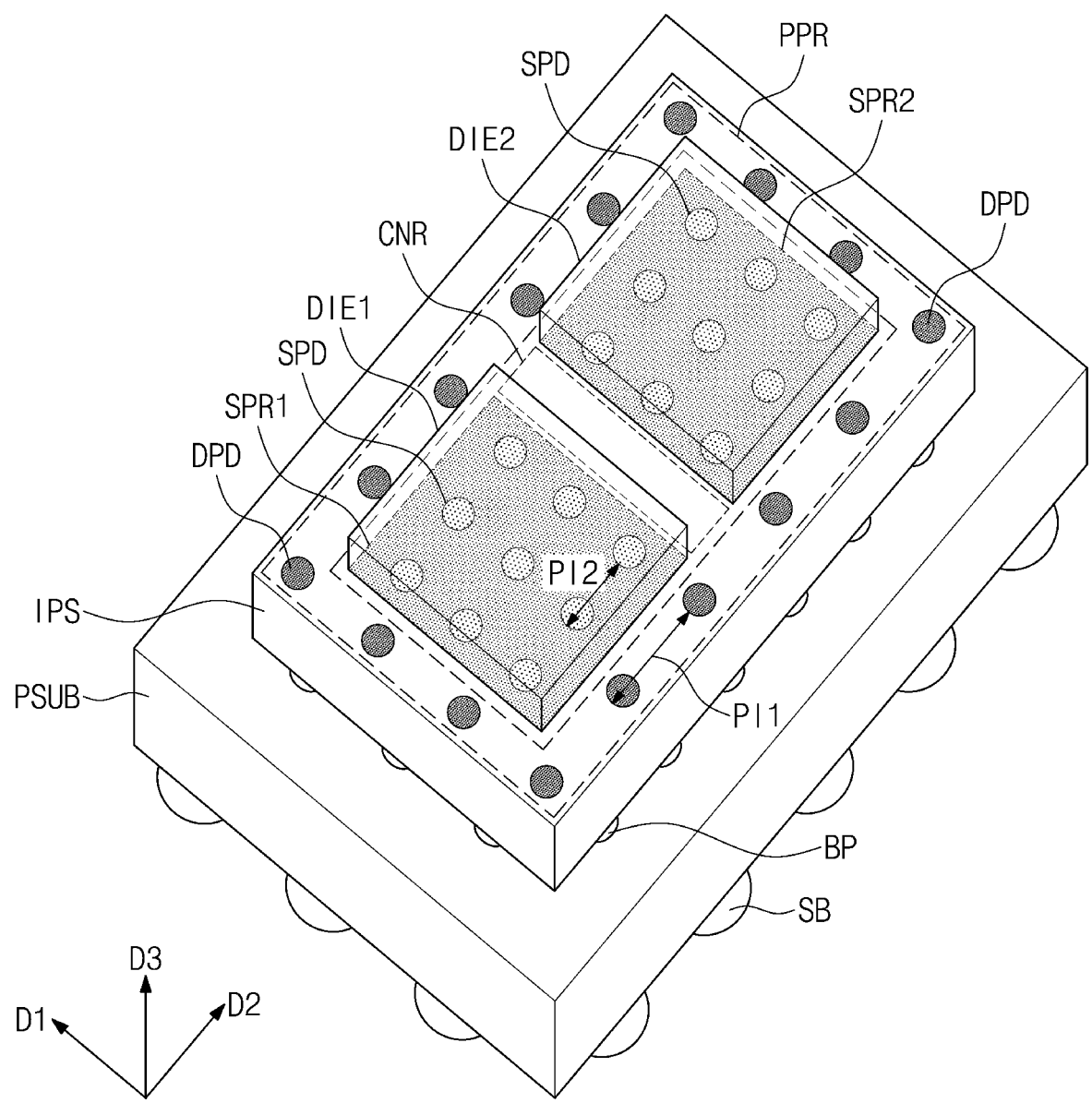
FIG. 1 is a perspective view illustrating a semiconductor package according to an embodiment of the inventive concept.
Figure 2:
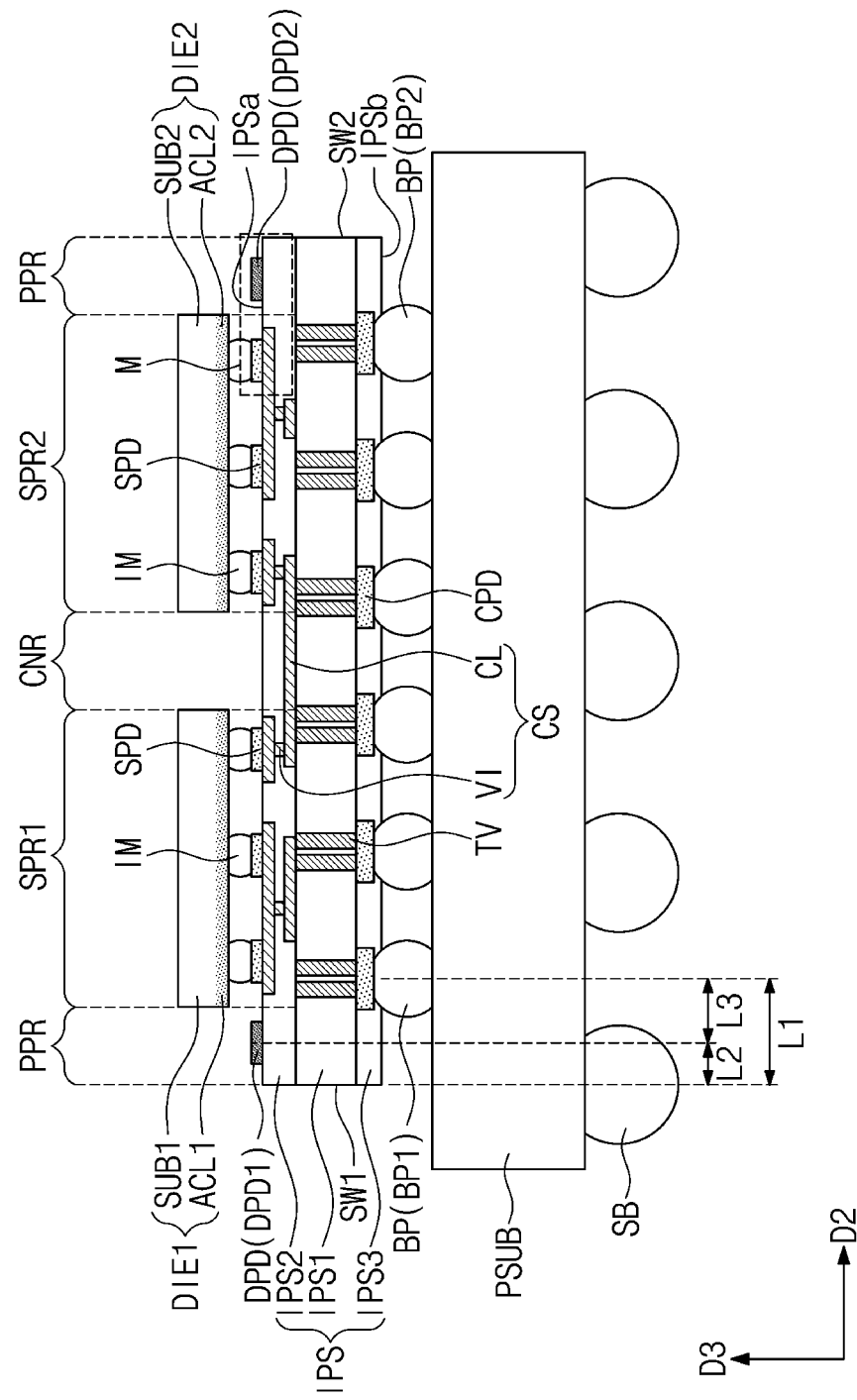
FIG. 2 is a sectional view of the semiconductor package of FIG. 1, according to an example embodiment.
Figure 3:
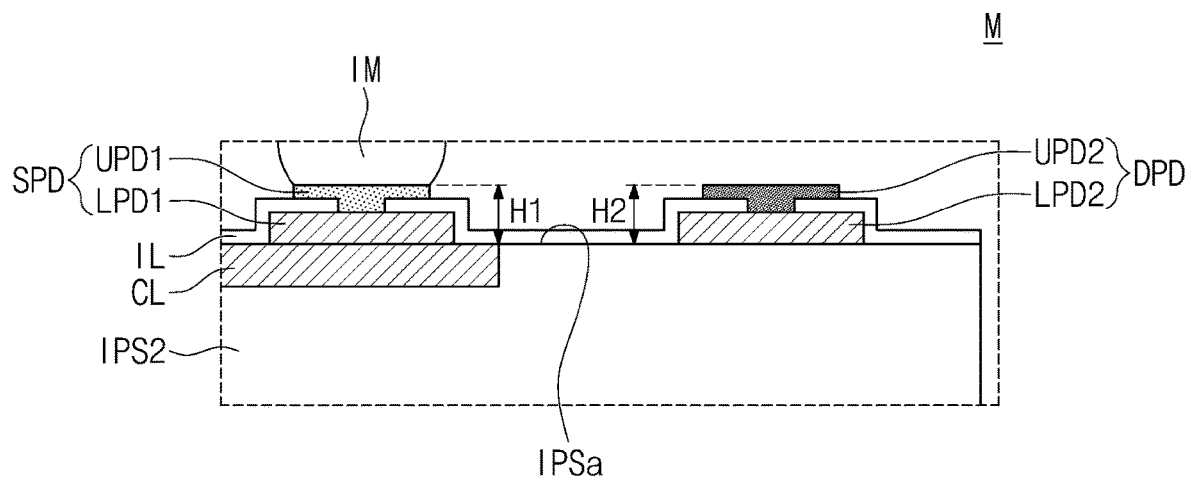
FIG. 3 is an enlarged sectional view of a portion 'M' of FIG. 2, according to an example embodiment.

FIG. 1 is a perspective view illustrating a semiconductor package according to an embodiment of the inventive concept. FIG. 2 is a sectional view of the semiconductor package of FIG. 1. FIG. 3 is an enlarged sectional view of a portion 'M' of FIG. 2.

Referring to FIGS. 1 to 3, a package substrate PSUB may be provided. An interposer substrate IPS may be provided on the package substrate PSUB. As an example, the package substrate PSUB may be a printed circuit board (PCB). The interposer substrate IPS may be a redistribution layer substrate.

The interposer substrate IPS may have a first surface IPSa (e.g., a top surface) and a second surface IPSb (e.g., a bottom surface), which are opposite to each other. The second surface IPSb may face the package substrate PSUB (e.g., a top surface of the package substrate PSUB). First outer terminals BP, also described as interconnection terminals, or interposer terminals, may be provided on the second surface IPSb of the interposer substrate IPS, to be located at an external surface of the interposer substrate IPS and communicate outside of the interposer substrate IPS. The first outer terminals BP may be interposed between the interposer substrate IPS and the package substrate PSUB, and therefore may electrically connect to the interposer substrate IPS and the package substrate PSUB. For example, the first outer terminals BP may include conductive bumps.

Second outer terminals SB, also described as external connection terminals, or package terminals, may be provided on a bottom surface of the package substrate PSUB. The second outer terminals SB may include, for example, solder balls. Although not shown, the package substrate PSUB may include routing lines and at least one via, which are provided therein.

The first surface IPSa of the interposer substrate IPS may include a first signal region SPR1, a second signal region SPR2, a connection region CNR, and a peripheral region PPR. The first signal region SPR1 and the second signal region SPR2 may be disposed side by side in a second direction D2. The second signal region SPR2 may be spaced apart from the first signal region SPR1 in the second direction D2. The connection region CNR may be interposed between the first signal region SPR1 and the second signal region SPR2.

The peripheral region PPR may be a remaining region of the first surface IPSa, other than the first signal region SPR1, the second signal region SPR2, and the connection region CNR. The first signal region SPR1, the second signal region SPR2, and the connection region CNR may be located in an inner region of the first surface IPSa. The peripheral region PPR may be located in an edge region of the first surface IPSa. The peripheral region PPR may be provided to enclose and to be outside of the first signal region SPR1, the second signal region SPR2, and the connection region CNR.

A first die DIE1 and a second die DIE2 may be provided on the first surface IPSa of the interposer substrate IPS. The first die DIE1 and the second die DIE2 may be mounted on the interposer substrate IPS to be disposed side by side in the second direction D2. The first die DIE1 and the second die DIE2 may be mounted on the first signal region SPR1 and the second signal region SPR2, respectively. Each of the first die DIE1 and the second die DIE2 may be a logic die including a central processing unit or a memory die including a memory cell, and may be described as a semiconductor chip, which includes an integrated circuit formed thereon.

The first die DIE1 may include a first substrate SUB1 and a first active layer ACL1 on the first substrate SUB1. The first active layer ACL1 may include transistors, which are formed on the first substrate SUB1, and interconnection layers, which are provided on the transistors (e.g., on a first surface of the first substrate SUB1 facing the interposer substrate IPS). The second die DIE2 may include a second substrate SUB2 and a second active layer ACL2, which is provided on the second substrate SUB2. The second active layer ACL2 may include transistors, which are formed on the second substrate SUB2, and interconnection layers, which are provided on the transistors (e.g., on a first surface of the second substrate SUB2 facing the interposer substrate IPS).

The first die DIE1 may be mounted on the interposer substrate IPS in a face-down manner, in which the first active layer ACL1 faces a first surface IPSa of the interposer substrate IPS. The second die DIE2 may be mounted on the interposer substrate IPS in a face-down manner, in which the second active layer ACL2 faces the first surface IPSa of the interposer substrate IPS.

Signal pads SPD may be provided on the first signal region SPR1 and the second signal region SPR2. For example, a plurality of the signal pads SPD may be provided on the first signal region SPR1, and a plurality of the signal pads SPD may be provided on the second signal region SPR2. Signal pads, as described herein, are positioned in a location, and are used, for transmitting signals between two devices or circuits which the signal pads connect. Each signal pad SPD is configured to transfer signals between the interposer substrate and a respective semiconductor chip. The various pads described herein may be provided on or near an external surface of the device on which they are formed, and may generally have a planar surface area. The pads may be formed of a conductive material, such a metal including one or more of Au, Ni, Cu, or Al, for example, formed in one or more layers.

Connection terminals IM may be respectively interposed between the first die DIE1 and the signal pads SPD on the first signal region SPR1. The connection terminals IM may be interposed between the second die DIE2 and the signal pads SPD on the second signal region SPR2. The connection terminal IM may be disposed on each of the signal pads SPD. The first and second dies DIE1 and DIE2 and the interposer substrate IPS may be electrically connected to each other through the connection terminals IM and the signal pads SPD. For example, each signal pad SPD for the first die DIE1 or for the second die DIE2 may be disposed on the top surface of the interposer substrate IPS. As an example, the connection terminals IM may include micro bumps.

The signal pads SPD on the first signal region SPR1 (e.g., a first plurality of signal pads) may be used to exchange at least one of data signals, command signals, or access signals between the first die DIE1 and the interposer substrate IPS, and are therefore electrically connected to wiring in the interposer substrate IPS and one or more circuits in the first die DIE1. The signal pads SPD on the second signal region SPR2 (e.g., a second plurality of signal pads) may be used to exchange at least one of data signals, command signals, or access signals between the second die DIE2 and the interposer substrate IPS, and are therefore electrically connected to wiring in the interposer substrate IPS and one or more circuits in the second die DIE2. For example, each of the signal pads SPD may serve as a path to transmit at least one of data, command, or access signals.

The first and second dies DIE1 and DIE2 may be mounted on the interposer substrate IPS in a flip-chip bonding manner by the connection terminals IM, and may be horizontally separated from each other. Although not shown, a region between the first and second dies DIE1 and DIE2 and the interposer substrate IPS may be filled with an under-fill resin layer.

The first and second dies DIE1 and DIE2 may be electrically connected to each other through the interposer substrate IPS. At least one of data, command, or access signals may be exchanged between the first and second dies DIE1 and DIE2 through the interposer substrate IPS.

Hereinafter, the interposer substrate IPS will be described in more detail. The interposer substrate IPS may include a first insulating layer IPS1, a second insulating layer IPS2 on the first insulating layer IPS1, and a third insulating layer IPS3 below the first insulating layer IPS1. The first insulating layer IPS1 may be interposed between the second and third insulating layers IPS2 and IPS3, and may be a core layer (e.g., a non-conductive core layer). The first insulating layer IPS1 may in some embodiments be formed of undoped silicon, and therefore may serve as an insulating layer even though it is formed of a semiconductor material. Or it may be formed of another insulating material. The layers IPS1, ISP2, and IPS3 may also be described as non-conductive layers.

A conductive structure CS may be provided in the second insulating layer IPS2. The conductive structure CS may include a plurality of conductive lines CL and a plurality of vias VI (e.g., conductive vias). The via VI may connect one of the conductive lines CL thereon to another of the conductive lines CL thereunder. The signal pad SPD on the first signal region SPR1 may be electrically connected to the signal pad SPD on the second signal region SPR2 through the conductive structure CS. In other words, the signal pads SPD may be electrically connected to each other through the conductive structure CS of the interposer substrate IPS. The conductive line CL, which electrically connects the first and second dies DIE1 and DIE2 to each other, may constitute a signal line. The signal line may be disposed in the connection region CNR of the interposer substrate IPS. The connection region CNR may be horizontally between the first die DIE1 and the second die DIE2. Conductive lines may be formed in or on the interposer substrate in the first connection region CNR. In addition, in some embodiments, no dummy pads are formed on the top surface of the interposer substrate IPS above the conductive lines in the first connection region CNR.

Conductive pads CPD may be provided in the third insulating layer IPS3. The third insulating layer IPS3 may cover the conductive pads CPD. The first outer terminals BP may be provided on the conductive pads CPD, respectively. The first outer terminal BP may be interposed between the conductive pad CPD and the package substrate PSUB.

Through vias TV may be provided in the first insulating layer IPS1. The through vias TV may penetrate the first insulating layer IPS1. The through vias TV may electrically connect the conductive structure CS to the conductive pads CPD, and may be referred to as conductive through vias.

Dummy pads DPD may be provided on the peripheral region PPR. The dummy pads DPD may be electrically disconnected from the first and second dies DIE1 and DIE2. For example, the connection terminal IM may not be provided on each of the dummy pads DPD. The dummy pads DPD may be exposed to the air during manufacturing after the first and second dies DIE1 and DIE2 have been mounted on the interposer substrate IPS, and may be covered with a protection layer or a mold layer (e.g., molding material) in a finished product. For example, the dummy pads DPD may be covered with an insulating material, and may not be electrically connected to any other conductive material. In some embodiments, the dummy pads DPD are not positioned, connected, or configured to transmit or receive signals between two devices or circuits (such as between the interposer substrate IPS and any semiconductor chip disposed thereon), and thus dummy pads are not signal pads. In some embodiments, the dummy pads are electrically isolated from any wiring or circuits in the interposer substrate. Furthermore, as can be seen in FIGS. 1 and 2, the dummy pads DPD may have a bottom surface facing the interposer substrate IPS and a top surface facing away from the interposer substrate IPS, and the top surface of each dummy pad DPD contacts an insulating material and does not contact an electrically conductive material. In some embodiments, the bottom surface of each dummy pad DPD also contacts in insulating material and does not contact an electrically conductive material.

In some embodiments (not shown), each dummy pad of the plurality of dummy pads is connected to a dummy TSV (through substrate via) passing through the interposer substrate IPS.

The dummy pads DPD may be arranged in the second direction D2. A pitch between the dummy pads DPD arranged in the second direction D2 may be a first pitch PI1. The first pitch PI1 may range from 40 μm to 200 μm. The signal pads SPD may be arranged in the second direction D2. A pitch between the signal pads SPD arranged in the second direction D2 may be a second pitch PI2. As an example, the first pitch PI1 may be greater than the second pitch PI2. As another example, the first pitch PI1 may be equal to or smaller than the second pitch PI2. In one example embodiment, the first pitch PI1 has a value between about 40 μm and about 200 μm, and the second pitch PI2 has a value between about 30 μm and about 150 μm. In this case, in one embodiment, the first pitch PI1 may be greater than the second pitch PI2. In some embodiments, the dummy pads DPD are arranged in first and second directions respectively parallel to a first edge of the interposer substrate IPS and a second edge of the interposer substrate IPS perpendicular to the first edge. In addition, adjacent dummy pads in each of the first direction and second direction may be separated from each other by no more than 200 μm.

The signal pads SPD on the first signal region SPR1 may vertically overlap the first die DIE1. The signal pads SPD on the second signal region SPR2 may vertically overlap the second die DIE2. The dummy pads DPD in certain embodiments do not vertically overlap the first and second dies DIE1 and DIE2. When viewed in a plan view, the dummy pads DPD may be spaced apart from the first and second dies DIE1 and DIE2 to be outside of an area surrounding both the first die DIE1 and the second die DIE2. In this manner, a plurality of dummy pads DPD are disposed outside of an area occupied by a first semiconductor chip (e.g., first die DIE1) from a top-down view and outside of an area occupied by the second semiconductor chip (e.g., second die DIE2) from a top-down view, and are disposed on the top surface of the interposer substrate IPS. A set of dummy pads of the plurality of dummy pads DPD may be outside of an area occupied by an outer boundary of outermost interposer external terminals BP of the interposer substrate. In some embodiments, a first plurality of signal pads are arranged in first and second directions respectively parallel to a first edge of the interposer substrate IPS and a second edge of the interposer substrate IPS perpendicular to the first edge, and adjacent signal pads of the first plurality of signal pads in each of the first direction and second direction are separated from each other.

In certain embodiments, the dummy pads DPD are not connected to any conductive structure CS of the interposer substrate IPS. Therefore, the dummy pads DPD may be electrically disconnected from each other and from other signal-transmitting circuitry or conductive elements of the package. The dummy pads DPD may be electrically disconnected from any signal pads SPD.

The signal pads SPD may not be provided on the peripheral region PPR. For example, the signal pads SPD may be spaced apart from the peripheral region PPR. The signal pads SPD and the dummy pads DPD may not be provided on the connection region CNR. For example, the signal and dummy pads SPD and DPD may be spaced apart from the connection region CNR. In one embodiment, regarding pads located at the first surface IPSa of the interposer substrate IPS, only the signal pads SPD are selectively provided on the first and second signal regions SPR1 and SPR2, and only the dummy pads DPD are selectively provided on the peripheral region PPR. In some embodiments, a first plurality of signal pads (e.g. signal pads in the first signal region SPR1), a second plurality of signal pads (e.g. signal pads in the second signal region SPR2), and the plurality of dummy pads DPD are all located at the same vertical height above the top surface of the package substrate PSUB.

Referring back to FIG. 2, the interposer substrate IPS may have a first sidewall SW1 and a second sidewall SW2, which are opposite to each other in the second direction D2. A first dummy pad DPD1 of the dummy pads DPD may be adjacent to the first sidewall SW1. An outermost terminal BP1 of the first outer terminals BP may be adjacent to the first sidewall SW1. The first dummy pad DPD1 may be closer (in a horizontal direction) to the first sidewall SW1 than the outermost terminal BP1. In other words, when viewed in a plan view, a distance between the first dummy pad DPD1 and the first sidewall SW1 may be smaller than a distance between the outermost terminal BP1 and the first sidewall SW1.

A second dummy pad DPD2 of the dummy pads DPD may be adjacent to the second sidewall SW2. An outermost terminal BP2 of the first outer terminals BP may be adjacent to the second sidewall SW2. The second dummy pad DPD2 may be closer (in a horizontal direction) to the second sidewall SW2 than the outermost terminal BP2. In other words, when viewed in a plan view, a distance between the second dummy pad DPD2 and the second sidewall SW2 may be smaller than a distance between the outermost terminal BP2 and the second sidewall SW2.

As can be seen from FIGS. 1 and 2, a set of dummy pads of the plurality of dummy pads DPD may surround or be outside of an area occupied by an outer boundary of outermost interposer terminals BP of the interposer substrate IPS, from a top-down view. Furthermore, outermost dummy pads of the plurality of dummy pads DPD may be horizontally closer to a side surface of the interposer substrate IPS than outermost interposer terminals BP of the interposer substrate IPS, from a top-down view.

A first distance L1 between the first sidewall SW1 and a center of the outermost terminal BP1 (e.g., in the second direction D2) may range from 300 μm to 1000 μm. Preferably, the first distance L1 ranges from 300 μm to 500 μm. A second distance L2 between the first sidewall SW1 and a center of the first dummy pad DPD1 (e.g., in the second direction D2) may range from 100 μm to 800 μm. Preferably, the second distance L2 ranges from 100 μm to 300 μm. A third distance L3 between a center of the outermost terminal BP1 and a center of the first dummy pad DPD1 (e.g., in the second direction D2) may range from 50 μm to 200 μm.

Referring back to FIG. 3, the signal pad SPD may include a first lower pad LPD1 on the first surface IPSa of the interposer substrate IPS and a first upper pad UPD1 on the first lower pad LPD1. The connection terminal IM may be disposed on the first upper pad UPD1. The first lower pad LPD1 may be electrically connected to the conductive line CL of the interposer substrate IPS.

The dummy pad DPD may include a second lower pad LPD2 on the first surface IPSa of the interposer substrate IPS and a second upper pad UPD2 on the second lower pad LPD2. In some embodiments, the dummy pad DPD has the same size, shape, and/or structure of the signal pad SPD, and may be formed of the same materials as the signal pad SPD. For example, from a top-down view, the dummy pads DPD may each have a circular, rectangular, or other polygonal shape, and the signal pads may have the same circular, rectangular, or other polygonal shape. The second upper pad UPD2 may be exposed to the air during manufacturing, and may be covered with a protection layer or a mold layer in the completed package. For example, the second upper pad UPD2 of the dummy pad DPD may be covered with an insulating material. The second lower pad LPD2 may be electrically disconnected from any conductive lines of the interposer substrate IPS.

An insulating layer IL may be provided on the first surface IPSa of the interposer substrate IPS. The insulating layer IL may be a passivation layer covering the interposer substrate IPS. The insulating layer IL may include a silicon oxide layer, a silicon nitride layer, or an insulating polymer layer, for example. A portion of a top surface of the first lower pad LPD1 may be covered with the insulating layer IL. A portion of a top surface of the second lower pad LPD2 may be covered with the insulating layer IL.

A height from the first surface IPSa of the interposer substrate IPS to the top surface of the first upper pad UPD1 may be a first height H1. A height from the first surface IPSa of the interposer substrate IPS to the top surface of the second upper pad UPD2 may be a second height H2. The first height H1 and the second height H2 may be substantially equal to each other. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In some embodiments, a ratio of a difference between the first and second heights H1 and H2 to the first height H1 (i.e., (H1−H2)/H1) may be less than 0.2. For example, even where the first and second heights H1 and H2 are not the same as each other, the ratio of a difference between the first and second heights H1 and H2 to the first height H1 (i.e., (H1−H2)/H1) may be less than 0.05, or may range from 0.05 to 0.2. In example experimentation, even in a range for a ratio of (H1−H2)/H1 up to 0.2, package defects resulting from insufficiently heated outer interposer terminals were greatly decreased.

As can be seen from FIGS. 1-3, in some embodiments, a first plurality of signal pads SPD each have a first height from their bottom surface to their top surface, and the dummy pads DPD each have a second height from their bottom surface to their top surface. The first height may be the same as the second height.

The dummy pads described above may be formed of a thermally conductive material, which may also be an electrically conductive material. In some embodiments, each signal pad of a first plurality of signal pads which correspond to a first semiconductor chip and a second plurality of signal pads which correspond to a second semiconductor chip is formed in part or wholly of the same electrically conductive material that forms the dummy pads.

Figure 4:
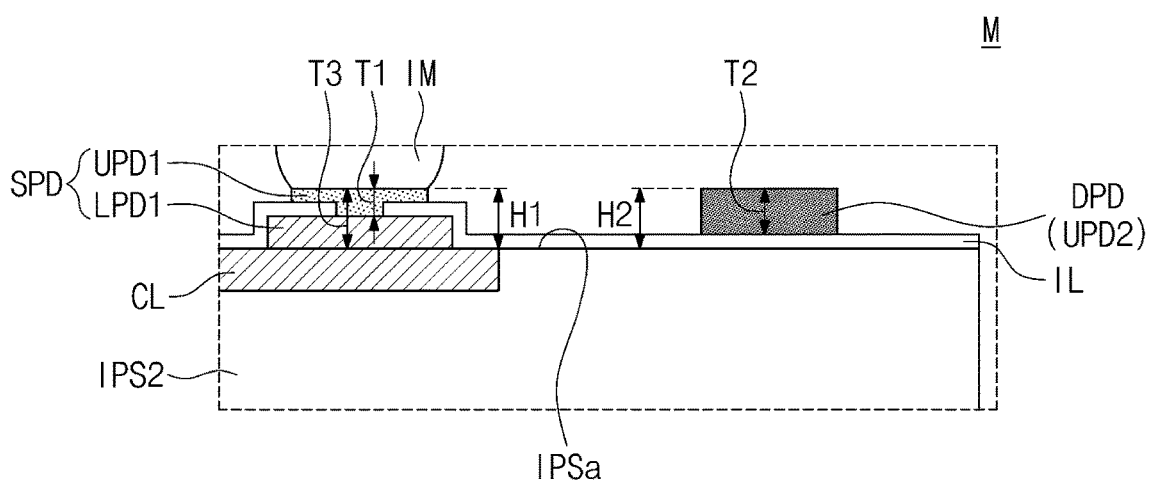
FIG. 4 is an enlarged sectional view of a portion (e.g., the portion 'M' of FIG. 2) of a semiconductor package according to an embodiment of the inventive concept.

FIG. 4 is an enlarged sectional view of a portion (e.g., the portion 'M' of FIG. 2) of a semiconductor package according to an embodiment of the inventive concept. For concise description, elements previously described with reference to FIGS. 1 to 3 may be identified by the same reference number without repeating an overlapping description thereof.

Referring to FIG. 4, the signal pad SPD may include the first lower pad LPD1 on the first surface IPSa of the interposer substrate IPS and the first upper pad UPD1 on the first lower pad LPD1. The insulating layer IL may be provided on the first surface IPSa. The dummy pad DPD may include the second upper pad UPD2 on the insulating layer IL. Unlike that described with reference to FIG. 3, the second lower pad LPD2 may be omitted from the dummy pad DPD according to the present embodiment. The dummy pad DPD may be spaced apart from the first surface IPSa of the interposer substrate IPS with the insulating layer IL interposed therebetween.

A height from the first surface IPSa of the interposer substrate IPS to a top surface of the first upper pad UPD1 may be the first height H1. A height from the first surface IPSa of the interposer substrate IPS to a top surface of the second upper pad UPD2 may be the second height H2. The first height H1 and the second height H2 may be substantially equal to each other. In some embodiments, a ratio of a difference between the first and second heights H1 and H2 to the first height H1 (i.e., (H1−H2)/H1) may be less than 0.05, or may range from 0.05 to 0.2.

A thickness of the first upper pad UPD1 (e.g., a maximum thickness in a vertical direction, or a thickness from a surface of the first lower pad LPD1 to a top surface of the first upper pad UPD1) may be a first thickness T1. A thickness of the second upper pad UPD2 (e.g., a maximum thickness in a vertical direction, or a thickness from a surface of the insulating layer IL to a top surface of the second upper pad UPD2) may be a second thickness T2. The second thickness T2 may be greater than the first thickness T1. The second thickness T2 may be smaller than the second height H2.

A thickness of the signal pad SPD (e.g., a maximum thickness in a vertical direction, or a thickness from a surface of conductive line CL to a top surface of the first upper pad UPD1) may be a third thickness T3. A sum of the thickness (i.e., T1) of the first upper pad UPD1 and a thickness of the first lower pad LPD1 may be the third thickness T3. The third thickness T3 may be substantially equal to the first height H1. A thickness of the dummy pad DPD may be the second thickness T2. The second thickness T2 may be smaller than the third thickness T3.

Figure 5:
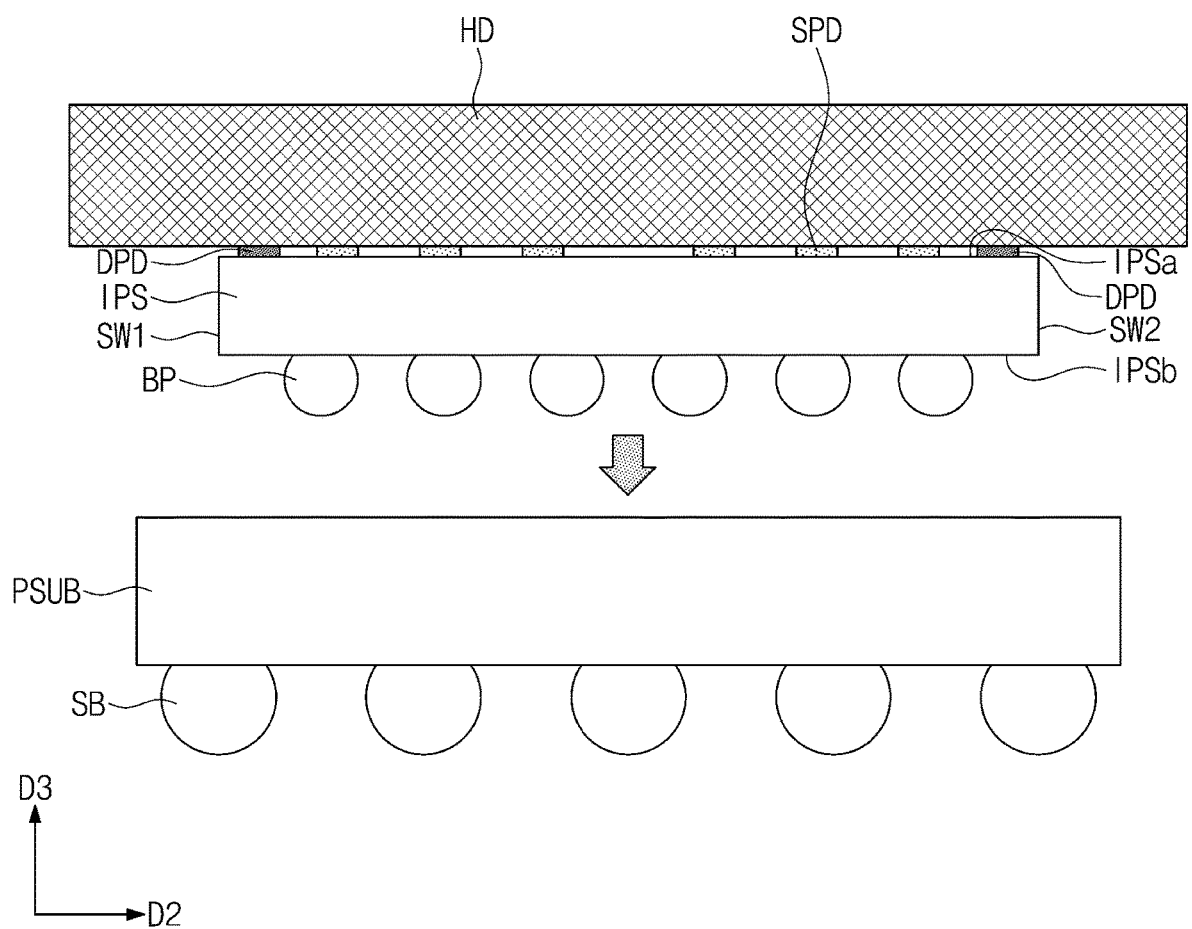
FIGS. 5 and 6 are sectional views illustrating a method of fabricating a semiconductor package (e.g., of FIG. 1) according to an embodiment of the inventive concept.
Figure 6:
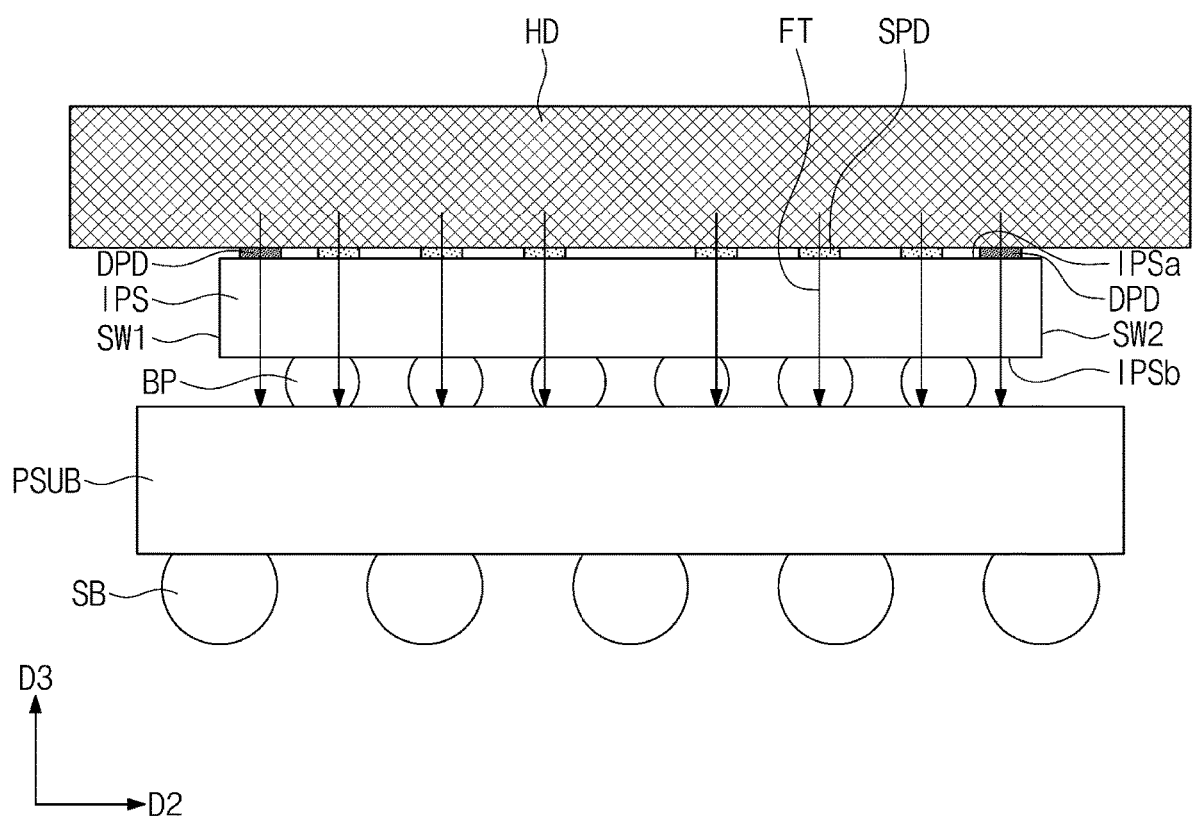
Figure 7:
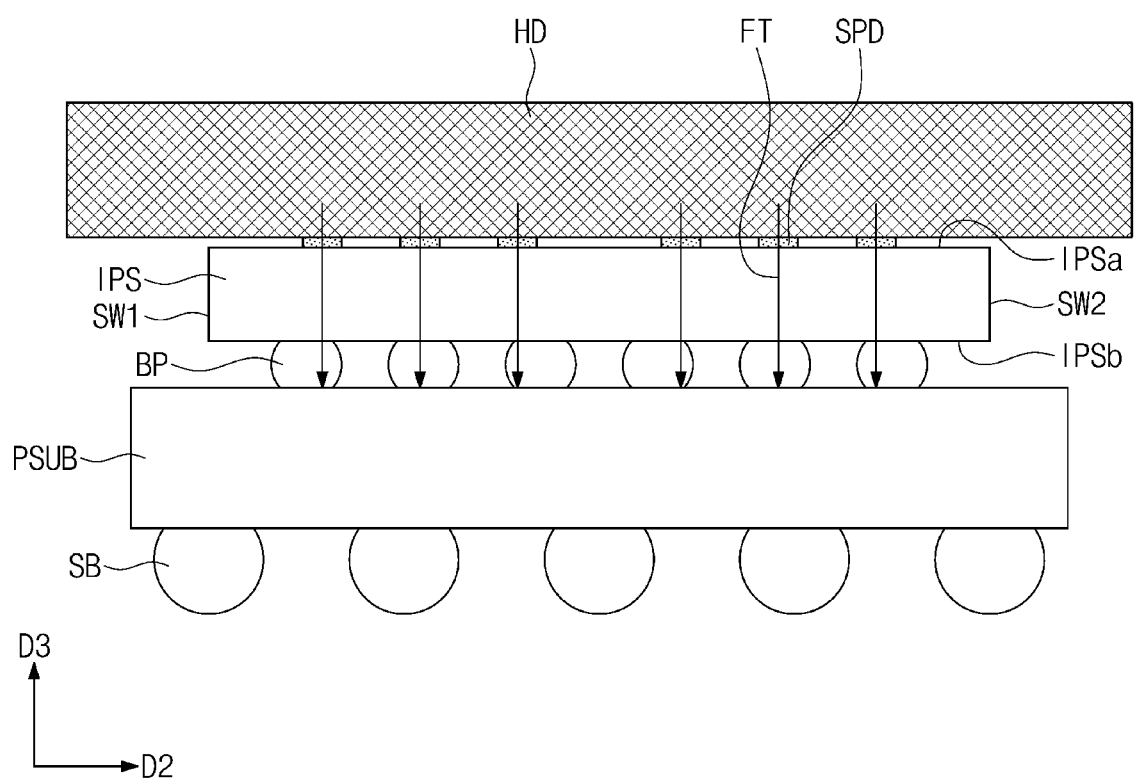
FIG. 7 is a sectional view illustrating a method of fabricating a semiconductor package, according to a comparative embodiment of the inventive concept.
Figure 13:
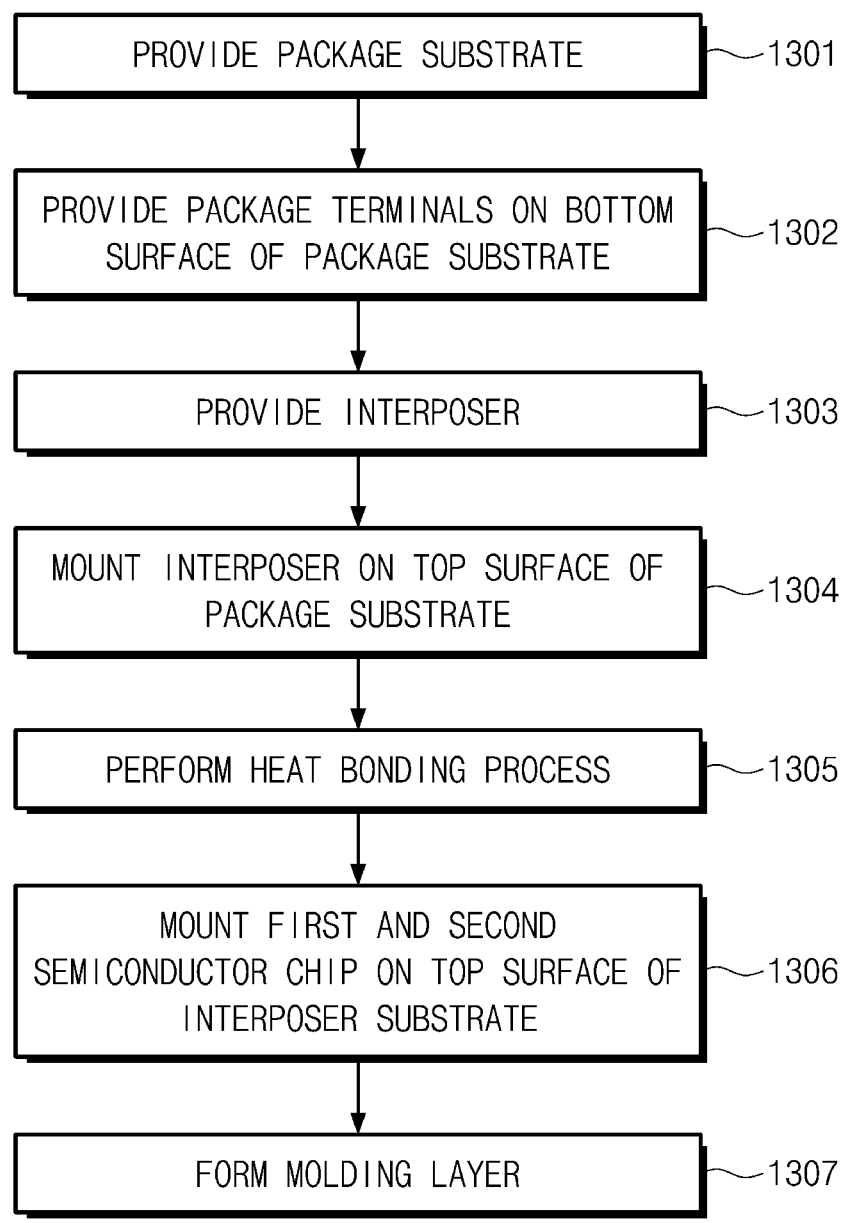
FIG. 13 is a flow chart illustrating an example method of manufacturing a semiconductor package in accordance with certain embodiments.

FIGS. 5 and 6 are sectional views illustrating a method of fabricating a semiconductor package (e.g., of FIG. 1) according to an embodiment of the inventive concept. FIG. 7 is a sectional view illustrating a method of fabricating a semiconductor package, according to a comparative embodiment of the inventive concept. FIG. 13 is a flow chart illustrating an example method of manufacturing a semiconductor package in accordance with certain embodiments. FIGS. 5, 6, and 13, and their comparison to FIG. 7 are discussed below.

As shown in FIGS. 5, 6, and 13, in step 1301, a package substrate having a bottom surface and a top surface is provided. For example, the package substrate may be package substrate PSUB such as shown in FIGS. 1 and 2. In step 1302, a plurality of package terminals, such as second outer terminals SB, are provided on the bottom surface of the package substrate PSUB. It should be noted, that although certain of the steps of the method shown in FIG. 13 are described in a particular order, the steps need not occur in that described order. For example, the plurality of package terminals can be provided to the bottom surface of the package substrate PSUB either before subsequent steps (e.g., before steps 1303-1307), or after one or more of the subsequent steps (e.g., after one of steps 1303, 1304, 1305, 1306, or 1307).

In step 1303, an interposer including an interposer substrate (e.g., IPS) having a top surface (e.g., IPSa) and a bottom surface (e.g., IPSb) is provided. The interposer may include a plurality of interposer terminals BP disposed on the bottom surface of the interposer substrate IPS. The interposer may further include a first plurality of signal pads SPD disposed on the top surface IPSa of the interposer substrate IPS to occupy a first area of the interposer substrate IPS, and electrically connected to wiring in the interposer substrate. The first plurality of signal pads SPD are configured for electrically connecting to one or more circuits in a first semiconductor chip (e.g., DIE1). The interposer further includes a second plurality of signal pads disposed on the top surface IPSa of the interposer substrate IPS to occupy a second area of the interposer substrate IPS, the second area horizontally separate from the first area, the second plurality of signal pads electrically connected to wiring in the interposer substrate IPS and for electrically connecting to one or more circuits in a second semiconductor chip (e.g. DIE2). The interposer further includes a plurality of dummy pads (e.g., DPD) disposed outside of the first area and the second area from a top-down view and disposed on the top surface of the interposer substrate.

In step 1304, the interposer substrate IPS is mounted on the top surface of the package substrate PSUB so that the plurality of interposer terminals BP are between the interposer substrate IPS and the package substrate PSUB.

In step 1305, a heat bonding process is performed to bond the interposer substrate IPS to the package substrate PSUB through the interposer terminals BP.

For example, referring to FIG. 5, the interposer substrate IPS may be provided on the package substrate PSUB. In detail, the interposer substrate IPS may be attached to a bottom surface of a heat-bonding head HD, and then, the interposer substrate IPS may be placed on the package substrate PSUB using the head HD. The bottom surface of the head HD may face the first surface IPSa of the interposer substrate IPS. The bottom surface of the head HD may be in contact with the signal pads SPD and the dummy pads DPD of the interposer substrate IPS.

Referring to FIG. 6, the interposer substrate IPS stacked on the package substrate PSUB is compressed by the head HD. The compression of the interposer substrate IPS may be performed during stacking the interposer substrate IPS on the package substrate PSUB. The compression of the interposer substrate IPS may include performing a thermo-compression bonding process of applying heat and pressure to the interposer substrate IPS. During the thermo-compression bonding process, heat and force FT may be transferred from the head HD toward the first outer terminals BP through the signal pads SPD and the dummy pads DPD, some or all of which the head HD may contact. The first outer terminals BP may be bonded to the package substrate PSUB by the heat and force FT transferred to the first outer terminals BP. In certain embodiments, contacting the plurality of dummy pads with the heated heat-bonding head HD heats a portion of the interposer substrate outside of the area occupied by the first plurality of signal pads and outside of the area occupied by the second plurality of signal pads, which heat is transferred to the outermost interposer terminals of the plurality of interposer terminals BP. As a result of the heating of the signal pads SPD and dummy pads DPD, for signal pads or dummy pads that are connected to a further metal component, an inter-metallic compound may be formed between the pad the further metal component. In some embodiments, a dummy pad DPD or a signal pad SPD may be formed of a plurality of metal layers, and as a result of the thermos-compression heat bonding process, an inter-metallic compound may be formed between the different metal layers (e.g., wherein the compound is formed of the metals from the different metals layers) so that the pad includes the different metal layers and the inter-metallic compound. For example, a pad may include an inter-metallic compound at an interface between two metal layers, such as an Au layer and an Ni layer, of the pad.

Referring back to FIG. 13, in step 1306, after performing the heat bonding process, a first semiconductor chip (e.g., DIE1) is mounted on the top surface of the interposer substrate and the first semiconductor chip is connected to the first plurality of signal pads, and a second semiconductor chip is mounted on the top surface of the interposer substrate and the second semiconductor chip (e.g., DIE2) is connected to the second plurality of signal pads. The first semiconductor chip is disposed to be horizontally separated from the second semiconductor chip. According to the certain embodiments, after these mountings, the plurality of dummy pads are outside of an area occupied by the first semiconductor chip and outside of an area occupied by the second semiconductor chip in a top down view. Also, in some embodiments, no dummy pads are on the top surface of the interposer substrate in an area between the first semiconductor chip and the second semiconductor chip in the top down view.

The plurality of dummy pads may be outside an area, in a top-down view, occupied by all of the interposer terminals on the bottom surface of the interposer substrate. In some embodiments, none of the plurality of dummy pads are connected to any wiring of the interposer substrate for transmitting signals through the interposer substrate.

In step 1307, a molding layer formed of a molding material is formed to encapsulate at least the interposer substrate and the first semiconductor chip and second semiconductor chip. The molding material may cover and contact each dummy pad of the plurality of dummy pads. For example, the molding material may be a resin or other insulative moldable material.

Referring to FIG. 7, the dummy pads DPD are omitted from the interposer substrate IPS, unlike the interposer substrate IPS according to an embodiment of the inventive concept. A thermo-compression bonding process may be performed on the interposer substrate IPS through the head HD. During the thermo-compression bonding process, the heat and force FT may be transferred from the head HD toward the first outer terminals BP through the signal pads SPD. According to this comparative embodiment, since the dummy pads DPD are omitted, the heat and force FT may not be transferred to or may be reduced at an edge region of the interposer substrate IPS. In this case, there may be a failure in contact or coupling between the first outer terminals BP and the package substrate PSUB.

By contrast, according to embodiments of the inventive concept, the heat and force FT may be transferred through not only the signal pads SPD but also the dummy pads DPD, which are disposed on the peripheral region PPR of the interposer substrate IPS, as previously described with reference to FIG. 6. Thus, the heat and force FT from the head HD may be uniformly transferred to the entire region of the interposer substrate IPS. As a result, according to an embodiment of the inventive concept, it may be possible to prevent a failure in contact or coupling between the first outer terminals BP and the package substrate PSUB and to realize a stable bonding structure.

According to the description of FIG. 2, the third distance L3 between the outermost terminal BP1 and the first dummy pad DPD1 may range from 50 μm to 200 μm. Since the distance between the outermost terminal BP1 and the first dummy pad DPD1 is relatively short, the heat and force FT may be effectively transferred from the first dummy pad DPD1 to the outermost terminal BP1. If the third distance L3 between the first dummy pad DPD1 and the outermost terminal BP1 is greater than 200 μm, the heat and force FT may not be effectively transferred from the first dummy pad DPD1 to the outermost terminal BP1.

According to an embodiment of the inventive concept, the heat and force FT from the head HD may be efficiently transferred toward the first outer terminals BP through the conductive structure CS and the through vias TV in the interposer substrate IPS, as previously described with reference to FIG. 2.

Figure 8:
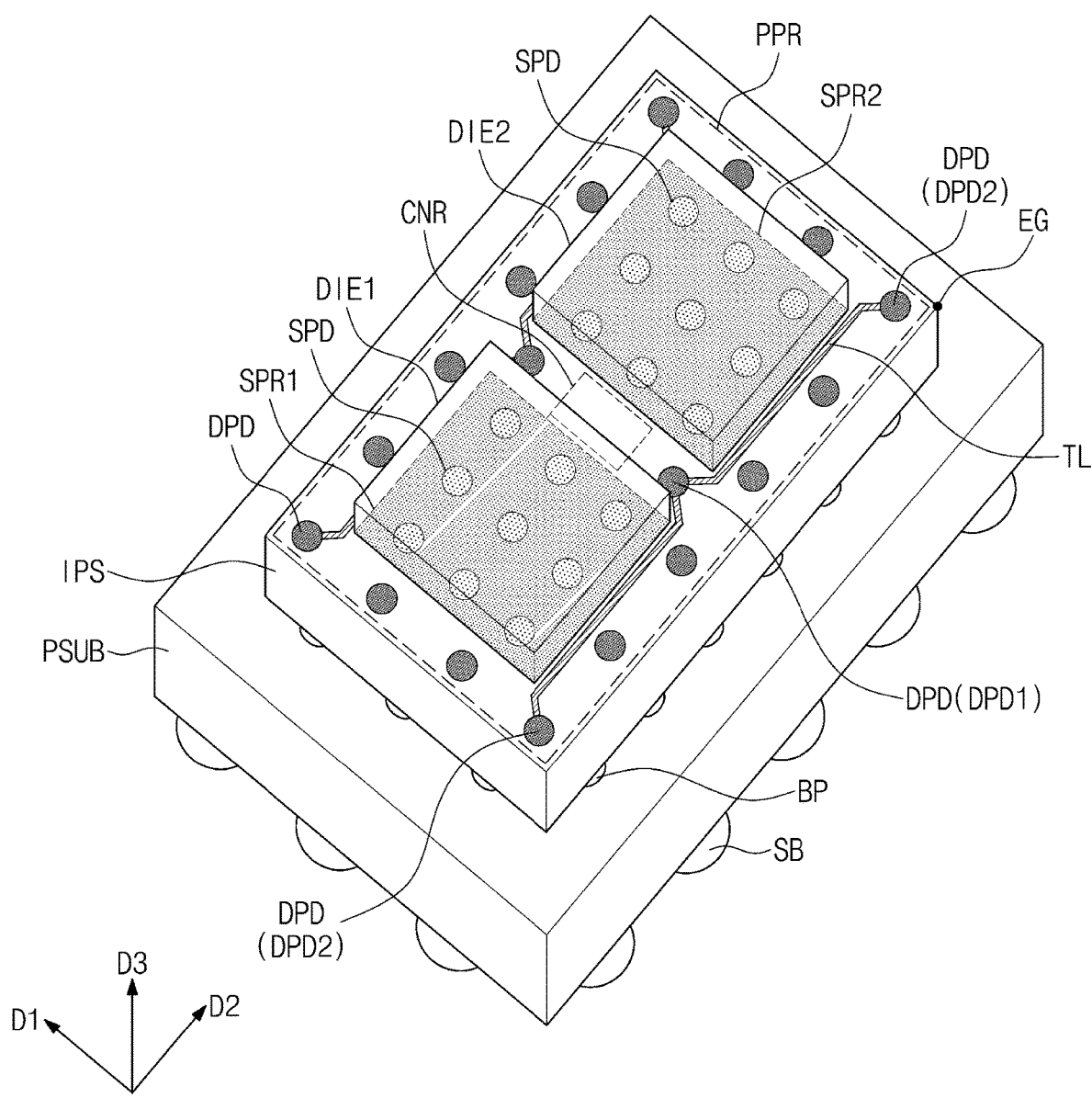
FIG. 8 is a perspective view illustrating a semiconductor package according to an embodiment of the inventive concept.
Figure 9:
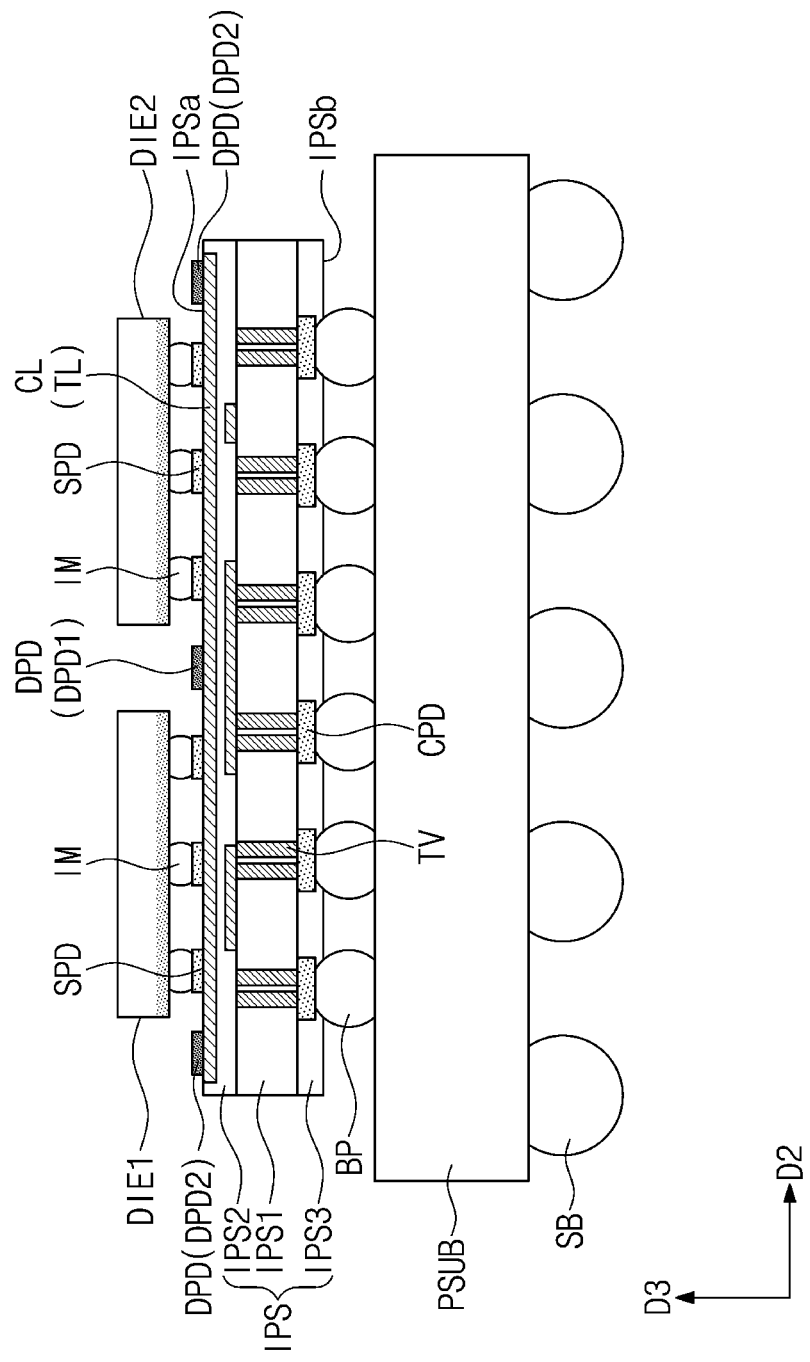
FIG. 9 is a sectional view of the semiconductor package of FIG. 8, according to an example embodiment.

FIG. 8 is a perspective view illustrating a semiconductor package according to an embodiment of the inventive concept. FIG. 9 is a sectional view of the semiconductor package of FIG. 8. For concise description, elements previously described with reference to FIGS. 1 to 3 may be identified by the same reference number without repeating an overlapping description thereof.

Referring to FIGS. 8 and 9, the dummy pads DPD may include the first dummy pads DPD1 adjacent to or closer to the center or central portion (e.g., either in the first direction D1 or the second direction D2) of the first surface IPSa of the interposer substrate IPS and the second dummy pads DPD2 adjacent to a corner EG of the interposer substrate IPS.

The first dummy pads DPD1 may be disposed adjacent to the first signal region SPR1, the second signal region SPR2, and the connection region CNR. The first dummy pads DPD1 may be disposed between the first signal region SPR1 and the second signal region SPR2, and therefore may be horizontally between the first semiconductor chip (DIE1) and the second semiconductor chip (DIE2) from the top-down view.

For example, the first dummy pads DPD1 may be dummy pads of the plurality of dummy pads DPD that are closest to the first and second signal regions SPR1 and SPR2 (e.g., closest to both of the first and second signal regions SPR1 and SPR2). The second dummy pads DPD2 may be dummy pads that are one of the dummy pads DPD and are farthest from the first and second signal regions SPR1 and SPR2. The second dummy pads DPD2 may be corner dummy pads. The second dummy pads of the plurality of dummy pads, as well as another set of dummy pads (e.g., the dummy pads other than dummy pads DPD1 and DPD2) may be located outside of an area occupied by the first and second semiconductor chips and may not be horizontally between the first semiconductor chip and the second semiconductor chip.

A first dummy pad DPD1 and a second dummy pad DPD2 may be thermally connected to each other by a thermal line TL. Therefore, heat may be transferred from one of the first dummy pads DPD1 to one of the second dummy pads DPD2 by thermal conduction through the thermal line TL. The thermal line TL may be formed of a thermally and electrically conductive material and may be formed on or in the interposer substrate.

In detail, a first dummy pad DPD1 and a second dummy pad DPD2 may be connected to each other through the conductive line CL (e.g., a metal line) in the interposer substrate IPS. In other words, the conductive line CL connecting the first and second dummy pads DPD1 and DPD2 may constitute the thermal line TL. Alternatively, although not shown, a first dummy pad DPD1 and a second dummy pad DPD2 may be electrically connected to each other through a metal line (e.g., the thermal line TL), which is provided on the first surface IPSa of the interposer substrate IPS.

As previously described with reference to FIG. 6, the heat, which is transferred from the head HD during the thermo-compression bonding process, may be mainly concentrated on a center region of the interposer substrate IPS. As such, the heat may not be sufficiently transferred to a region near the corner EG of the interposer substrate IPS.

According to the embodiment of FIGS. 8 and 9, since the second dummy pad DPD2 positioned near the corner EG of the interposer substrate IPS is thermally connected to the first dummy pad DPD1 positioned near the center of the interposer substrate IPS through the thermal line TL, the heat may be transferred from the center of the interposer substrate IPS to the corner EG of the interposer substrate IPS. As a result, the heat may be uniformly transferred to the entire region of the interposer substrate IPS, during the thermo-compression bonding process.

Figure 10:
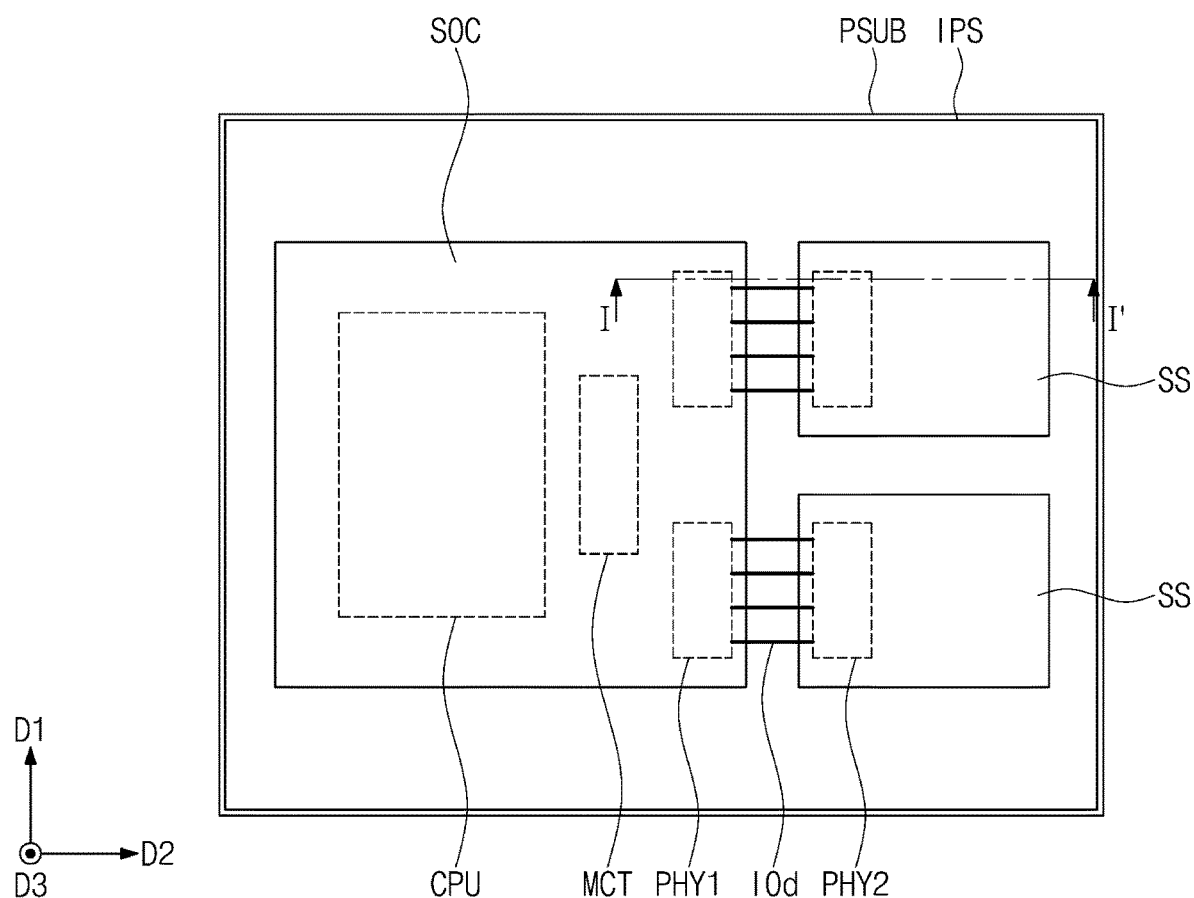
FIG. 10 is a plan view illustrating a semiconductor package according to an embodiment of the inventive concept.
Figure 11:
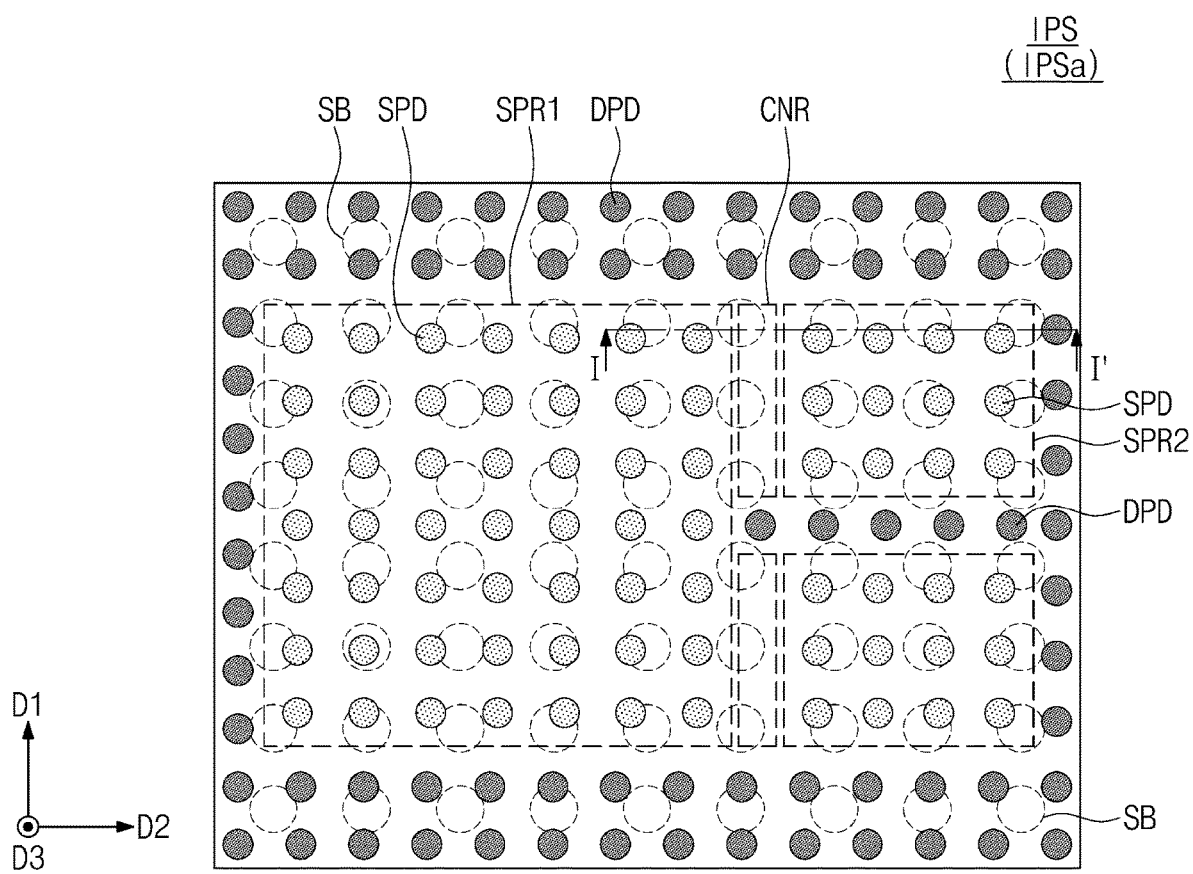
FIG. 11 is a plan view illustrating a first surface of an interposer substrate of FIG. 10, according to an example embodiment.
Figure 12:
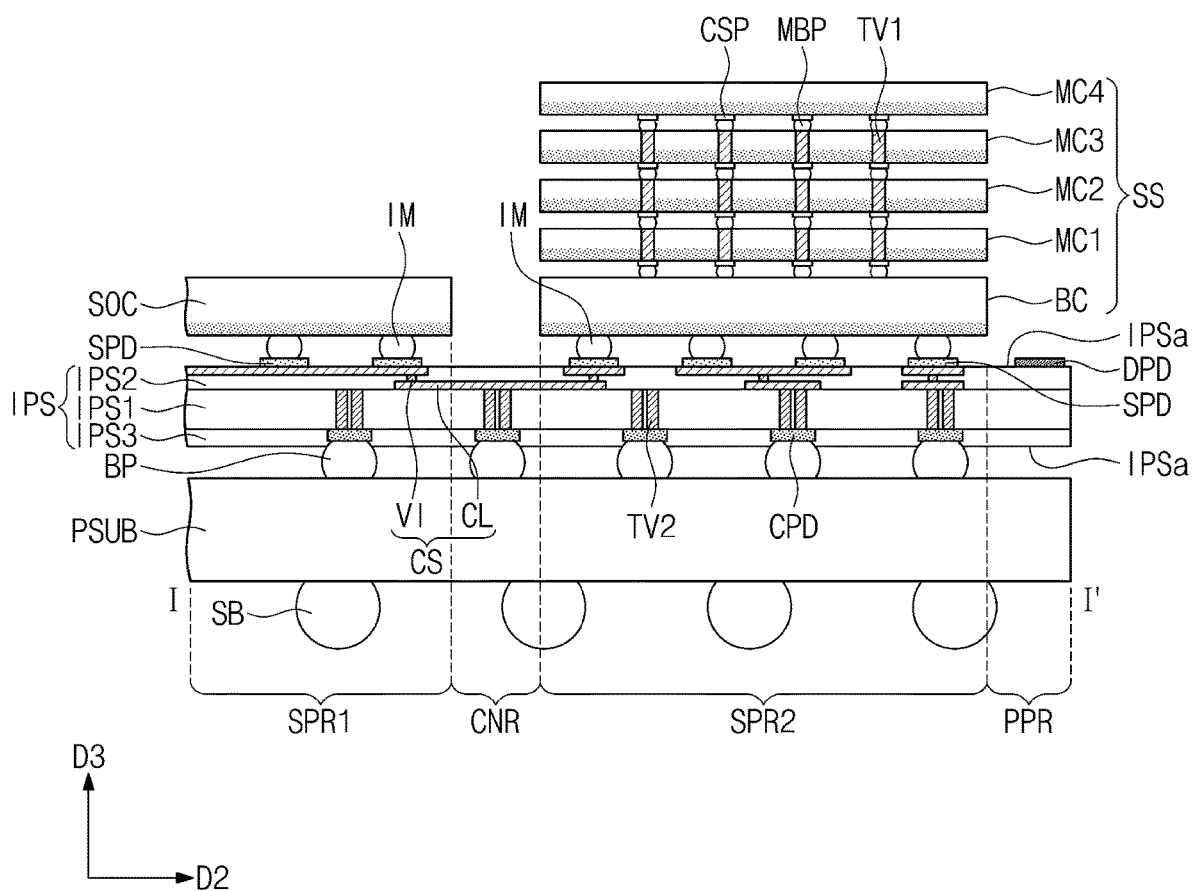
FIG. 12 is a sectional view taken along a line I-I' of FIG. 10, according to an example embodiment.

FIG. 10 is a plan view illustrating a semiconductor package according to an embodiment of the inventive concept. FIG. 11 is a plan view illustrating a first surface of an interposer substrate of FIG. 10. FIG. 12 is a sectional view taken along a line I-I' of FIG. 10. For concise description, an element previously described with reference to FIGS. 1 to 3 may be identified by the same reference number without repeating an overlapping description thereof.

Referring to FIGS. 10, 11, and 12, the interposer substrate IPS may be provided on the package substrate PSUB. The signal pads SPD may be provided on the first signal region SPR1 and the second signal regions SPR2 of the interposer substrate IPS. The dummy pads DPD may be provided on the peripheral region PPR of the interposer substrate IPS.

The interposer substrate IPS may include the conductive structure CS in the second insulating layer IPS2, second through vias TV2 in the first insulating layer IPS1, and the conductive pads CPD in the third insulating layer IPS3. The conductive structure CS may include a plurality of the conductive lines CL and a plurality of the vias VI.

A logic die SOC may be disposed on the first signal region SPR1 of the interposer substrate IPS. A plurality of memory stacks SS may be disposed on the second signal regions SPR2 of the interposer substrate IPS. A first chip that comprises the logic die SOC may be a single chip not part of a stack of chips. A second chip that comprises one of the memory chips may be at the same height above the interposer substrate as the first chip. For example, a pair of memory stacks SS may be disposed around or near the logic die SOC. However, the inventive concept is not limited to this example, and the number of the memory stacks SS may be variously changed. Each of the memory stacks SS and the logic die SOC may be mounted side by side (e.g., horizontally separated from each other) on the interposer substrate IPS.

The logic die SOC may include a central processing unit CPU, a first physical-layer interface region PHY1, and a memory controller MCT. For example, the logic die SOC may be a system-on-chip. The logic die SOC may be mounted on the interposer substrate IPS in a face-down manner (e.g., flip-chip manner), in which an active layer of the logic die SOC faces the interposer substrate IPS.

A plurality of the memory stacks SS may have substantially the same structure as each other. Hereinafter, one of the memory stacks SS will be exemplarily described. The memory stack SS may include a buffer die BC and first to fourth memory dies MC1-MC4, which are sequentially stacked on the buffer die BC.

The buffer die BC may be mounted on the interposer substrate IPS in a face-down manner (e.g., flip chip manner), in which an active layer of the buffer die BC faces the interposer substrate IPS. The first to fourth memory dies MC1-MC4 may be dynamic random access memory (DRAM) chips. According to the present embodiment, the first to fourth memory dies MC1-MC4 may have substantially the same chip size. For example, the first to fourth memory dies MC1-MC4 may be provided to have substantially the same planar shape and substantially the same planar area.

Each of the first to third memory dies MC1, MC2, and MC3 may include first through vias TV1, which are provided to penetrate the same. The fourth memory die MC4 may not include the first through via TV1. Micro bumps MBP may be provided between the buffer die BC and the first memory die MC1, between the first memory die MC1 and the second memory die MC2, between the second memory die MC2 and the third memory die MC3, and between the third memory die MC3 and the fourth memory die MC4.

The micro bumps MBP may be electrically connected to the first through vias TV1 of the first to third memory dies MC1, MC2, and MC3. The first to fourth memory dies MC1-MC4 may be electrically connected to the buffer die BC through the first through vias TV1 and the micro bumps MBP.

The connection terminals IM may be respectively interposed between the logic die SOC and the signal pads SPD on the first signal region SPR1. The connection terminals IM may be respectively interposed between the buffer die BC of the memory stack SS and the signal pads SPD on the second signal region SPR2. As an example, the connection terminals IM may include micro bumps.

The buffer die BC of the memory stack SS may include a second physical-layer interface region PHY2. Data lines IOd may be provided between the first physical-layer interface region PHY1 of the logic die SOC and the second physical-layer interface region PHY2 of the buffer die BC. Data may be exchanged between the logic die SOC and the buffer die BC through the data lines IOd. Conductive lines in the interposer substrate IPS may constitute the data lines IOd. The data lines IOd may be disposed below the connection region CNR of the interposer substrate IPS.

Referring back to FIGS. 11 and 12, the dummy pads DPD may be disposed in a remaining region of the first surface IPSa, other than the first and second signal regions SPR1 and SPR2 and the connection region CNR. The outermost one of the dummy pads DPD, which is adjacent to a sidewall of the interposer substrate IPS, may be horizontally closer to the sidewall than the outermost one of the first outer terminals BP, which is adjacent to the sidewall of the interposer substrate IPS.

As described herein, certain areas may be described from a top down view to describe the location of certain components. For example, the specification may refer to an area "occupied" by a semiconductor chip or by a plurality of pads or plurality of terminals. The use of this term in connection with a semiconductor chip refers to the area that the chip takes up, e.g., between boundaries formed by the edges of the chip, from a top down view. With respect to a set or plurality of terminals or a set or plurality of pads, an area "occupied" by the set or plurality of pads or terminals refers to an area including outermost pads or terminals of the set or plurality of pads or terminals and all space within boundaries created by the outermost pads or terminals.

The connection terminals IM are provided on the signal pads SPD, respectively. However, the connection terminals IM are not be provided on the dummy pads DPD. The signal pads SPD on the first signal region SPR1 may be vertically overlap the logic die SOC thereon. The signal pads SPD on the second signal region SPR2 may vertically overlap the memory stack SS thereon. In one embodiment, the dummy pads DPD do not vertically overlap either of the logic die SOC or the memory stack SS. When viewed in a plan view, the dummy pads DPD may be spaced apart from both of the logic die SOC and the memory stack SS.

Meanwhile, although not shown, the dummy pads DPD more adjacent to the center of the interposer substrate IPS may be connected to the dummy pads DPD adjacent to the corner of the interposer substrate IPS through the thermal line TL, similar to that previously described with reference to FIGS. 8 and 9.

According to various embodiments of the inventive concept, a dummy pad of an interposer substrate is used to prevent a failure in contact or coupling between the interposer substrate and a package substrate of a semiconductor package. As a result, it may be possible to realize a semiconductor package with improved electric characteristics.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

While example embodiments of the inventive concepts have been particularly shown and described, it will be understood by one of ordinary skill in the art that variations in form and detail may be made therein without departing from the spirit and scope of the attached claims.

We claim:

1. A semiconductor package comprising:
   a package substrate having a bottom surface and a top surface;
     a plurality of package terminals disposed on the bottom surface of the package substrate;
     an interposer substrate disposed on the top surface of the package substrate, the interposer substrate having a bottom surface facing the package substrate and a top surface opposite the bottom surface;
     a plurality of interposer terminals disposed on the bottom surface of the interposer substrate and electrically connected to the package substrate;
     a first semiconductor chip disposed on the top surface of the interposer substrate;
     a second semiconductor chip disposed on the top surface of the interposer substrate and disposed to be horizontally separated from the first semiconductor chip;
     a first plurality of signal pads disposed on the top surface of the interposer substrate and electrically connected to wiring in the interposer substrate and one or more circuits in the first semiconductor chip;
     a second plurality of signal pads disposed on the top surface of the interposer substrate and electrically connected to wiring in the interposer substrate and to one or more circuits in the second semiconductor chip; and
     a plurality of dummy pads disposed outside of an area occupied by the first semiconductor chip from a top-down view and outside of an area occupied by the second semiconductor chip from a top-down view and disposed on the top surface of the interposer substrate,
     wherein the first plurality of signal pads, the second plurality of signal pads, and the plurality of dummy pads are all located at the same vertical height above the top surface of the package substrate,
     wherein each pad of the first plurality of signal pads and the second plurality of signal pads is configured to transfer signals between the interposer substrate and a respective semiconductor chip,
     wherein each pad of the dummy pads is not configured to transfer signals between the interposer substrate and any semiconductor chip disposed thereon,
     wherein at least a first dummy pad of the plurality of dummy pads is located horizontally between the first semiconductor chip and the second semiconductor chip, and
     wherein at least a second dummy pad of the plurality of dummy pads is located outside of an area occupied by the first and second semiconductor chips and not horizontally between the first semiconductor chip and the second semiconductor chip.

2. The semiconductor package of claim 1, wherein:
   a set of dummy pads of the plurality of dummy pads surround an area occupied by an outer boundary of outermost interposer terminals of the interposer substrate, from a top-down view.

3. The semiconductor package of claim 1, wherein:
   outermost dummy pads of the plurality of dummy pads are horizontally closer to a side surface of the interposer substrate than outermost interposer terminals of the interposer substrate, from a top-down view.

4. The semiconductor package of claim 1:
   wherein the first dummy pad is thermally connected to the second dummy pad by a thermal line.

5. The semiconductor package of claim 4, wherein:
   the thermal line is formed of a thermally and electrically conductive material and is formed on or in the interposer substrate.

6. The semiconductor package of claim 1, wherein:
   the dummy pads are electrically isolated from any wiring or circuits in the interposer substrate.

7. The semiconductor package of claim 1, wherein:
   the dummy pads have a bottom surface facing the interposer substrate and a top surface facing away from the interposer substrate, and
   the top surface of each dummy pad contacts an insulating material and does not contact an electrically conductive material.

8. The semiconductor package of claim 7, wherein:
   the insulating material is a molding material formed to encapsulate the semiconductor package.

9. The semiconductor package of claim 1, wherein:
   the dummy pads have a bottom surface facing the interposer substrate and a top surface facing away from the interposer substrate, and
   the bottom surface of each dummy pad contacts an insulating material and does not contact an electrically conductive material.

10. The semiconductor package of claim 1, wherein:
    the first plurality of signal pads each have a first height from their bottom surface to their top surface,
    the dummy pads each have a second height from their bottom surface to their top surface, and
    the first height is the same as the second height.

11. The semiconductor package of claim 1, further comprising:
    a first connection region horizontally between the first semiconductor chip and the second semiconductor chip; and
    conductive lines formed in or on the interposer substrate in the first connection region,
    wherein no dummy pads are formed on the top surface of the interposer substrate above the conductive lines in the first connection region.

12. The semiconductor package of claim 1, wherein:
    the second dummy pad is one of a plurality of second dummy pads located outside of the area occupied by the first and second semiconductor chips and not horizontally between the first semiconductor chip and the second semiconductor chip;
    the plurality of second dummy pads are arranged in first and second directions respectively parallel to a first edge of the interposer substrate and a second edge of the interposer substrate perpendicular to the first edge; and
    adjacent dummy pads of the plurality of second dummy pads in each of the first direction and second direction are separated from each other by no more than 200 µm.

13. The semiconductor package of claim 1, wherein:
    the first plurality of signal pads are arranged in first and second directions respectively parallel to a first edge of the interposer substrate and a second edge of the interposer substrate perpendicular to the first edge; and
    adjacent signal pads of the first plurality of signal pads in each of the first direction and second direction are separated from each other by no more than 150 µm.

14. The semiconductor package of claim 1, wherein:
the first semiconductor chip is a logic chip; and
the second semiconductor chip is a die of a memory stack.

15. The semiconductor package of claim 14, wherein:
the first semiconductor chip is a single chip not part of a stack of chips; and
the second semiconductor chip is at the same height above the interposer substrate as the first semiconductor chip.

16. A semiconductor package comprising:
a package substrate having a bottom surface and a top surface;
a plurality of package terminals disposed on the bottom surface of the package substrate;
an interposer substrate disposed on the top surface of the package substrate, the interposer substrate having a bottom surface facing the package substrate and a top surface opposite the bottom surface;
a plurality of interposer terminals disposed on the bottom surface of the interposer substrate and electrically connected to the package substrate;
a first semiconductor chip disposed on the top surface of the interposer substrate;
a second semiconductor chip disposed on the top surface of the interposer substrate and disposed to be horizontally separated from the first semiconductor chip;
a first plurality of signal pads disposed on the top surface of the interposer substrate and electrically connected to wiring in the interposer substrate and one or more circuits in the first semiconductor chip;
a second plurality of signal pads disposed on the top surface of the interposer substrate and electrically connected to wiring in the interposer substrate and to one or more circuits in the second semiconductor chip; and
a plurality of dummy pads disposed outside of an area occupied by the first semiconductor chip from a top-down view and outside of an area occupied by the second semiconductor chip from a top-down view and disposed on the top surface of the interposer substrate,
wherein the first plurality of signal pads, the second plurality of signal pads, and the plurality of dummy pads are all located at the same vertical height above the top surface of the package substrate, and
wherein a set of dummy pads of the plurality of dummy pads are outside of an area occupied by an outer boundary of outermost interposer terminals of the interposer substrate, from a top-down view,
wherein each pad of the first plurality of signal pads and the second plurality of signal pads are for transferring signals; and
wherein each pad of the plurality of dummy pads is electrically isolated at its top surface by an insulating material.

17. The semiconductor package of claim 16, wherein:
each pad of the plurality of dummy pads does not transfer signals.

18. The semiconductor package of claim 16, wherein:
each dummy pad of the plurality of dummy pads is connected to a dummy TSV passing through the interposer substrate.

19. The semiconductor package of claim 16, wherein the insulating material is a molding layer formed of a molding material that encapsulates at least the interposer substrate and the first semiconductor chip and second semiconductor chip, wherein the molding material covers and contacts each dummy pad of the plurality of dummy pads.

20. A semiconductor package comprising:
a package substrate having a bottom surface and a top surface;
a plurality of package terminals disposed on the bottom surface of the package substrate;
an interposer substrate disposed on the top surface of the package substrate, the interposer substrate having a bottom surface facing the package substrate and a top surface opposite the bottom surface;
a plurality of interposer terminals disposed on the bottom surface of the interposer substrate and electrically connected to the package substrate;
a first semiconductor chip disposed on the top surface of the interposer substrate;
a second semiconductor chip disposed on the top surface of the interposer substrate and disposed to be horizontally separated from the first semiconductor chip;
a first plurality of signal pads disposed on the top surface of the interposer substrate and electrically connected to wiring in the interposer substrate and one or more circuits in the first semiconductor chip;
a second plurality of signal pads disposed on the top surface of the interposer substrate and electrically connected to wiring in the interposer substrate and to one or more circuits in the second semiconductor chip;
a first dummy pad disposed horizontally between the first semiconductor chip and the second semiconductor chip;
a second dummy pad disposed outside of an area occupied by the first and second semiconductor chips; and
a thermal line thermally connecting the first dummy pad to the second dummy pad.

* * * * *